United States Patent
Zhu et al.

(10) Patent No.: US 9,978,902 B2
(45) Date of Patent: *May 22, 2018

(54) PASSIVATION STACK ON A CRYSTALLINE SILICON SOLAR CELL

(71) Applicant: Institutt for Energiteknikk, Kjeller (NO)

(72) Inventors: Junjie Zhu, Oslo (NO); Su Zhou, Beijing (CN); Halvard Haug, Oslo (NO); Erik Stensrud Marstein, Skedsmokorset (NO); Sean Erik Foss, Skedsmokorset (NO); Wenjing Wang, Beijing West District (CN); Chunlan Zhou, Beijing (CN)

(73) Assignee: Institutt for Energiteknikk, Kjeller (NO)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/494,064

(22) Filed: Apr. 21, 2017

(65) Prior Publication Data

US 2017/0229600 A1 Aug. 10, 2017

Related U.S. Application Data

(63) Continuation-in-part of application No. 15/037,163, filed as application No. PCT/NO2014/050215 on Nov. 19, 2014, now Pat. No. 9,660,130.

(30) Foreign Application Priority Data

Nov. 19, 2013 (NO) .................................. 20131549

(51) Int. Cl.
*H01L 31/0216* (2014.01)
*H01L 31/18* (2006.01)
*H01L 21/02* (2006.01)

(52) U.S. Cl.
CPC ...... *H01L 31/1804* (2013.01); *H01L 21/0214* (2013.01); *H01L 21/02057* (2013.01); *H01L 21/02301* (2013.01); *H01L 31/02167* (2013.01)

(58) Field of Classification Search
CPC ......... H01L 21/02296; H01L 21/02436; H01L 21/02518; H01L 21/46
See application file for complete search history.

(56) References Cited

U.S. PATENT DOCUMENTS

2009/0056800 A1 3/2009 Ulyashin et al.
2011/0284068 A1 11/2011 Moslehi et al.

FOREIGN PATENT DOCUMENTS

| EP | 1304748 A2 | 4/2003 |
| GB | 2185626 A | 7/1987 |
| GB | 2471128 A | 12/2010 |

OTHER PUBLICATIONS

Dauwe, Stefan et al., Experimental Evidence of Parasitic Shunting in Silicon Nitride Rear Surface Passivated Solar Cells, Progress In Photovoltaics: Research and Applications, Prog, Photovolt: Res. Appl. 2002; 10:271-278 (DOI: 10.1002/pip.420).

(Continued)

*Primary Examiner* — Cheung Lee
(74) *Attorney, Agent, or Firm* — Christopher & Weisberg, P.A.

(57) ABSTRACT

A method for manufacturing a passivation stack on a crystalline silicon solar cell device. The method includes providing a substrate comprising a crystalline silicone layer such as a crystalline silicon wafer or chip, cleaning a surface of the crystalline silicon layer by removing an oxide layer at least from a portion of one side of the crystalline silicon layer, depositing, on at least a part of the cleaned surface, a layer of silicon oxynitride, and depositing a capping layer comprising a hydrogenated dielectric material on top of the (Continued)

layer of silicon oxynitride, wherein the layer of silicon oxynitride is deposited at a temperature from 100° C. to 200° C., and the step of depositing the layer of silicon oxynitride includes using $N_2O$ and $SiH_4$ as precursor gasses in an $N_2$ ambient atmosphere and depositing silicon oxynitride with a gas flow ratio of $N_2O$ to $SiH_4$ below 2.

17 Claims, 10 Drawing Sheets

(56) References Cited

OTHER PUBLICATIONS

Gatz, S. et al., Thermal stability of amorphous siliconi/silicon nitride stacks for passivating crystalline silicon solar cells, Applied Physics Letters 93, 173502 (2008).

Koch, Simon et a., Polarization Effects and Tests for Crystalline Silicon Cells, 26th European Photovoltaic Solar Energy Conference and Exhibition, Sep. 5-8, 2011, Hamburg, Germany.

Park, Young-Bae et al., Effect of N2O/SiH4 ratio on the properties of low-temperature silicon oxide films from remote plasma chemical vapour deposition, Elsevier, Thin Solid Films 280 (1996) 43-50.

Dingemans, G. and Kessels, W. M. M., Status and prospects of Al2O3-based surface passivation schemes for silicon solar cells, Journal of Vacuum Science & Technology A 30, 04082 (2012); doi: 10.1116/1.4728205.

Hallam, Brett et al., Effect of PECVD silicon oxynitride film composition on the surface passivation of silicon wafers, Elsevier, Solar Energy Materials & Solar Cells 96 (2012) 173-179.

International Search Report and Written Opinion dated Apr. 1, 2015 for corresponding International Application No. PCT/NO2014/050215 International Filing Date: Nov. 19, 2014 consisting of 9-pages.

Shibata, Noboru, Plasma-Chemical Vapor-Deposited Silicon Oxide/ Silicon Oxynitride Double-Layer Antireflective Coating for Solar Cells, Japanese Journal of Applied Physics, vol. 30, No. 5, May 1991, pp. 997-1001.

PASSIVATION STACK ON A CRYSTALLINE SILICON SOLAR CELL

CROSS-REFERENCE TO RELATED APPLICATION

This application is a continuation-in-part of U.S. patent application Ser. No. 15/037,163 having a filing date of May 17, 2016, entitled PASSIVATION STACK ON A CRYSTALLINE SILICON SOLAR CELL, which claims priority under 35 U.S.C. § 371 to International Application Number PCT/NO2014/050215, filed Nov. 19, 2014, which application is related to and claims priority from Norwegian Patent Number 20131549, filed Nov. 19, 2013, the entirety of all of which are incorporated herein by reference.

STATEMENT REGARDING FEDERALLY SPONSORED RESEARCH OR DEVELOPMENT n/a

FIELD OF INVENTION

The present invention relates to a method for manufacturing a passivation stack on a crystalline silicon solar cell device. More specifically the invention relates to passivating a crystalline silicon solar cell by means of a thermally stable passivation stack manufactured by means of a method according to the invention. The invention also relates to a crystalline silicon solar cell device obtainable by means of a method according to the invention.

BACKGROUND OF THE INVENTION

In the following, silicon shall mean crystalline, potentially doped, silicon if not stated otherwise. A person skilled in the art will understand that a crystalline silicon chip or wafer, when used as a basis for a solar cell, will be purposively doped to make the silicon p-type or n-type. Further, a person skilled in the art will also understand that dielectric layers mentioned in the following, might, depending on the means of deposition, include elements not shown in the stoichiometric formula. For instance, if deposited by means of chemical vapour deposition, the various dielectric layers might include hydrogen originating from one or more of the precursor gasses. The person skilled in the art will also understand that said dielectric layers may be amorphous or crystalline, depending of the deposition conditions and means.

The following references to other publications are indicated with reference numerals in square brackets, whereby relevant text of such references are included as parts of this disclosure as they contain technical information that person skilled in the art may find useful for understanding the background of the present invention.

The key parameter ratio for producing cost-effective solar cells is the cost per watt of output effect, e.g. dollar per watt. There are two ways of reducing the cost per watt; by increasing the efficiency of a solar cell and by reducing the cost of production.

Good surface passivation with a low surface recombination velocity is a prerequisite for obtaining high efficiency in silicon solar cell devices in which high minority carrier lifetime is of essence. Several dielectric materials are known which can be used, either alone or in combination, to passivate the surface of a silicon wafer or chip for obtaining reduced surface recombination. Examples of such layers are silicon nitride ($SiN_x$), amorphous silicon (a-Si), aluminium oxide ($Al_2O_x$) and thermally grown silicon oxide ($SiO_2$). Further, stacked combinations of two or more of the mentioned dielectric layers, such as $SiN_x$/a-Si; $SiN_x/SiO_2$ and $SiN_xAl_2O_x$, have also been shown to provide good surface passivation quality.

During the manufacturing of crystalline silicon-based solar cells, the solar cells are usually exposed to one or more process steps at high temperatures, typically in the range of 800° C. and above. One such process step is the firing, i.e. activation, of printed contacts to make a good connection between the contacts and a p-n junction provided in the wafer. In the presence of any dielectric passivation and/or anti-reflection layers, the contacts will typically have to be fired through the mentioned layers, entailing that the dielectric layers have to withstand the high temperature without losing the qualities enabling its intended purpose.

A-Si, alone or in a stack with $SiN_x$ or $SiO_2$, has been shown to give a close to perfect passivation of a crystalline silicon surface. However, studies have shown that a-Si loses its passivation properties if heated to above 500° C. [1]. A-Si also has a very high optical absorption in the lower wavelength range of visible light, and any a-Si layer on the front of a solar cell may therefor "steal" an amount of the incoming light. Thermal oxidation of silicon might also provide good surface passivation. However, the growth of such a $SiO_2$ layer requires high temperature over a prolonged period of time, which is unwanted for low-cost production due the amount of energy required for heating. In addition, the thermal budget also increases diffusion of impurities in the silicon, which usually is of sub-electronic grade when used for solar cells. The impurity migration might significantly degrade the minority carrier lifetime in the silicon, and thus the efficiency of a silicon solar cell. $SiN_x$ has been shown to give a decent passivation of crystalline silicon, but when used on p-type silicon wafers there have been problems with parasitic shunting due to the high positive charge in the $SiN_x$ layer [2]. More recently, $Al_2O_x$ with negative charge has been shown to provide very good surface passivation for p-type crystalline silicon [3]. However, $Al_2O_x$ is usually deposited by means of atomic layer deposition (ALD), which requires very high vacuum, and which has been challenging to incorporate with the rate of mass production usually envisaged for solar cell manufacturing.

Silicon oxynitride ($SiO_xN_y$) has been shown to be a promising dielectric material for surface passivation of silicon [4, 5]. It has also been investigated to use $SiO_xN_y$ in a stack with $SiN_x$ for surface passivation in photovoltaic applications [6]. However, the passivation quality reported so far has not been sufficient to obtain satisfactory low surface recombination velocities. Further, the thermal stability of $SiO_xN_y$ has been a challenge, and the passivation quality has generally degraded after high temperature treatment, such as contact firing. Deposition temperatures of $SiO_xN_y$ have generally been in range of 250° C. and above.

SUMMARY OF THE INVENTION

The invention has for its object to remedy or to reduce at least one of the drawbacks of the prior art, or at least provide a useful alternative to the prior art.

The object is achieved through features which are specified in the description below and in the claims that follow.

The manufacturing of solar cells as such is considered as known to the person skilled in the art, and the invention will only be discussed in as far as it differs from the prior art.

In a first aspect the invention relates to a method for manufacturing a passivation stack on a crystalline silicon solar cell device, the method comprising the steps of:
- providing a substrate comprising a crystalline silicone layer, such as a crystalline silicon wafer or chip;
- cleaning a surface of the crystalline silicon layer by removing an oxide layer at least from a portion of one side of the crystalline silicon layer;
- depositing, on at least a part of the cleaned surface, a layer of silicon oxynitride;
- depositing a capping layer comprising a hydrogenated dielectric material on top of the layer of silicon oxynitride, wherein the layer of silicon oxynitride is deposited at a temperature from 100° C. to 200° C., preferably from 100° C. to 150° C., and even more preferably from 100° C. to 130° C.
- using $N_2O$ and $SiH_4$ as precursor gasses in an $N_2$ ambient atmosphere; and
- depositing silicon oxynitride with a gas flow ratio of $N_2O$ to $SiH_4$ below 2, preferably below 1, and even more preferably around 0.5.

The effect of the very low deposition temperature is a significantly improved effect passivation and thermal stability, as will be described in more detail below with reference to the figures.

The combination of precursor gasses used to produce a passivation stack according to the first aspect of the invention has been shown to give surprisingly good passivation results. The applicant's experiments have shown that high silicon content in the silicon oxynitride is beneficial for the passivation quality. However, it has also been found that the sensitivity of the passivation quality on the composition of the silicon oxynitride reduces with reduced deposition temperature.

A person skilled in the art will be aware of different ways of removing an oxide from a layer of crystalline silicon. The oxide may be a so-called native oxide of a few nanometers naturally grown on a silicon substrate when exposed to an oxygen-containing atmosphere. As examples, the cleaning might be done by means of liquid hydrofluoric acid or by means of a plasma etch in a PECVD chamber. In addition, the layer of crystalline silicon may be cleaned chemically be means of a full RCA clean, by a piranha etch (mixture comprising sulphuric acid and hydrogen peroxide), or by other known cleaning procedures removing organic contaminants in addition to the oxide layer.

In one embodiment the step of depositing the layer of silicon oxynitride may include using plasma-enhanced chemical vapour deposition (PECVD). PECVD has been shown to produce dielectric layers with a high reproducibility, while at the same time being compatible with large-scale manufacturing of solar cells. A person skilled in the art will also understand the layer of silicon oxynitride might be deposited by means of other deposition methods, such as other chemical vapour deposition techniques and sputtering. The person skilled in the art will understand that the silicon oxynitride layer deposited by such means, and at the above-mentioned temperatures will be hydrogenized and amorphous, microcrystalline or mixed-phase.

In one embodiment the step of depositing the layer of silicon oxynitride may include depositing said layer with a thickness of less than 10 nm, preferably less than 5 nanometers, and even more preferably around 3 nanometers. The good passivation quality of silicon oxynitride has been shown to be realized already with layers with a thickness of only a few nanometers. Reduced thickness of said layer implies reduced deposition time. Further, a layer of silicon oxynitride of less than 10 nanometers facilitates any subsequent activation/firing of contacts through the layer of silicon oxynitride. This might be especially beneficial for the solar cell-related manufacturing processes where, in one of the final manufacturing steps, a metal-containing paste is fired through a dielectric passivation and anti-reflection coating on top of the solar cell to make contact with a highly doped surface layer of the solar cell. Finally, a thinner layer will also imply less optical absorption in the layer, i.e. more light entering the solar cell, and thus increased efficiency.

In one embodiment the step of depositing the capping layer of the hydrogenated dielectric may include depositing said layer with a thickness of more than 25 nm, and preferably 40 nm or more. It has been shown that a dielectric capping layer of a certain thickness is beneficial for obtaining the maximum passivation quality, and also for improved thermal stability. The beneficial effect is observed with hydrogenated dielectric layers of a thickness 25 nm and above, with a maximum effect with layers with a thickness of 40 nanometers and above, such as from 40 nanometers to 100 nanometers, including at 75 nanometers. The reason is believed to be the need for a sufficient supply of hydrogen to the layer of silicon oxynitride, from the hydrogenated dielectric layer, for realisation of a chemical passivation effect of the crystalline silicon.

In one embodiment the step of depositing the capping layer comprising the hydrogenated dielectric may include depositing said hydrogenated dielectric layer in the same step as depositing said layer of silicon oxynitride. This may significantly reduce manufacturing time. As example, the layer of silicon oxynitride and the capping layer of the hydrogenated dielectric may be deposited by means of the same method and the same apparatus, such by means of PECVD, and possibly even in the same PECVD chamber.

In one embodiment the step of depositing a capping layer comprising a hydrogenated dielectric includes depositing a layer of hydrogenated silicon nitride. Experiments have shown that hydrogenated silicon nitride may be especially well suited as a capping layer for silicon oxynitride for the purpose of achieving good surface passivation for solar cells. Silicon nitride is also frequently used, either alone or in a stack, as an anti-reflection coating on solar cells. Hence, the combination of silicon oxynitride with a capping layer comprising silicon nitride may be very well suited both for passivation and for anti-reflection purposes. The thickness of the silicon nitride may be tailored so as to optimize the anti-reflection properties of a solar cell as will be known to a person skilled in the art. Silicon nitride may be used as the sole deposited capping layer, or it may be used in a stack with other dielectrics, such as with non-thermal silicon oxide.

In one embodiment the method, after the deposition of the layer of silicon oxynitride and the hydrogenated dielectric capping layer, may comprise the step of heating the crystalline silicon substrate at a temperature of above 700° C., preferably around 800° C. Peak heating may last for a few seconds, typically 2-4 seconds.

In one embodiment the method also relates to the manufacturing of a silicon solar cell, the method comprising any embodiment of the method for the manufacturing of the silicon solar cell device discussed above.

A layer of silicon oxynitride deposited by means of any embodiment of the invention as mentioned above has been shown to be particularly stable under subsequent high temperature steps. In contrast to silicon oxynitride layers deposited by means of methods according to prior art, a silicon oxynitride layer deposited by means of a method according to the present invention maintains or even improves its passivation qualities after being exposed to high temperature manufacturing steps, which typically corresponds to temperatures used for contact firing as mentioned above.

In a second aspect the invention relates to a crystalline silicon solar cell device obtainable by means of a method according to the above description.

In a third aspect the invention also relates to a crystalline silicon solar cell comprising the above-mentioned solar cell device. The applicant has performed tests showing a significant efficiency gain for a solar cell comprising a passivation stack deposited by means of a method according to the first aspect of the invention compared to a solar cell without the layer of silicon oxynitride. In particular, the applicant has performed experiments showing a 0.4% absolute efficiency gain for a multi-crystalline Si solar cell comprising a $SiN_x/SiO_xN_y$ stack compared to a similar solar cell with a $SiN_x$ layer only.

Another significant advantage of a solar cell according to the third aspect of the invention has been shown to be an improved resistance to potential induced degradation (PID) when using such a solar cell in a solar module. PID is an undesirable effect sometimes occurring in solar cells and modules and often leading to unexplainable yield losses. The yield losses are typically seen as reduced shunt resistances and thus a loss in a module's maximum power point and open-circuit voltage. One source of PID has been found to be mobile sodium ions diffusing from the front glass of a module to the cell surface due to a force caused by potential induced stress, though the mechanisms involved once the sodium ions reach the silicon are not well understood [7]. The present applicant has found, through experimental studies, that silicon solar cells according to the third aspect of the invention, i.e. having passivation stacks as prepared by means of a method according to the first aspect of the invention, have a significantly improved resistance to PID compared to silicon solar cells without said passivation stack. The experiments were performed by means of a PIDcon from Freiburg Instruments GmbH. The silicon solar cells used were p-type multi crystalline cells with an anti-reflection coating of hydrogenized silicon nitride. The cells were prepared with and without a layer of silicon oxynitride between the anti-reflection coating and the substrate, the former type thus representing a silicon solar cell according to the third aspect of the invention. Modules with silicon solar cells of either the former or the latter type were tested at a temperature of 60° C. for 24 hours at a voltage of 1000 V. The results showed significantly increased shunt resistances, without degradation, for modules comprising the silicon solar cells according to the third aspect of the invention.

BRIEF DESCRIPTION OF THE DRAWINGS

In the following are described examples of preferred embodiments illustrated in the accompanying drawings, wherein.

DETAILED DESCRIPTION OF THE INVENTION

Silicon wafers used in the experiments were cleaned by a piranha etch and a subsequent removal of oxide in hydrofluoric acid. Both silicon oxynitride $SiO_xN_y$ and a capping layer of hydrogenated silicon nitride ($SiN_x$ for simplicity) were deposited by means of PEVCD, in the same PECVD chamber. In the experiments the $SiO_xN_y$ layer was deposited with $SiH_4$ and $N_2O$ as the precursors in $N_2$ ambient. Alternatively, the $SiO_xN_y$ layer may be deposited with $SiH_4$ and $N_2O$ as the precursors in an Ar ambient atmosphere, or with no ambient atmosphere. The flow ratio of $N_2O$ to $SiH_4$ was varied from 0:13 to 1000:13, resulting in different stoichiometric $SiO_xN_y$ layers, ranging from hydrogenated amorphous silicon (a-Si) through $SiO_xN_y$ to silicon oxide ($SiO_x$). $SiO_xN_y$ was deposited at temperatures ranging from 100° C. to 400° C. with a thickness from 1 to 40 nm and above. The temperature was measured in the deposition chamber as will be understood by a person skilled in the art. The capping layer of hydrogenated $SiN_x$ was deposited with $SiH_4$ and $NH_3$ as the precursor gasses.

The deposition temperature was varied from 130° C. to 400° C. and the flow ratio of $SiH_4$ to $NH_3$ was varied from 20:20 to 45:20, resulting $SiN_x$ layers with different reflective index. After depositing the $SiN_x/SiO_xN_y$ stack, some of the passivated samples were heated/annealed in a belt furnace with a peak temperature of 800° C. for 3 s, corresponding to a standard contact firing step during the manufacturing of crystalline silicon solar cells.

Figure 1:
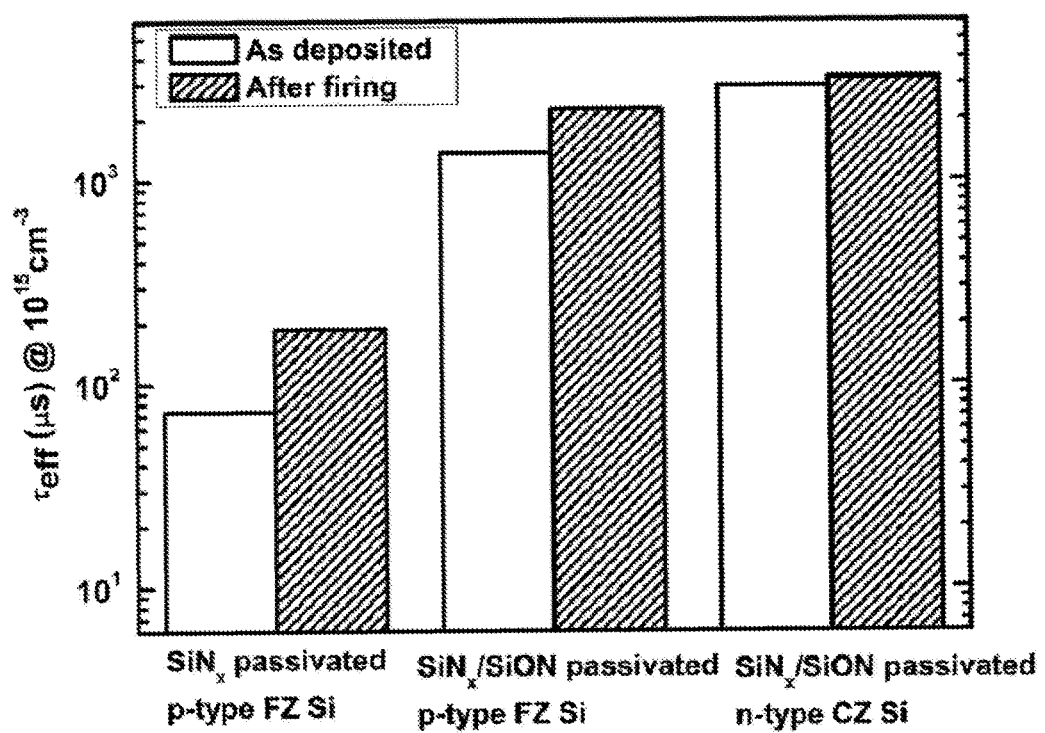
FIG. 1 shows the effective minority carrier lifetime in various passivated crystal-line silicon substrates.

FIG. 1 shows the effective minority carrier lifetime, $T_{eff}$ in microseconds, for both p- and n-type crystalline silicon wafers passivated using a stack of $SiN_x/SiO_xN_y$ according to the present invention and compared with a standard passivation of a single layer of hydrogenated $SiN_x$, both before firing, shown in open columns, and after firing, shown in hatched columns. In this experiment the $SiO_xN_y$ layer was deposited with a $N_2O:SiH_4$ ratio of 20:45. The $SiN_x$ layer had a thickness of 75 nm. The p-type wafers were of Float-Zone (FZ) quality with a resistivity of 1-3 ohm·cm, while the n-type wafers were of Czochralski (CZ) quality with a resistivity of 1-3 ohm·cm. $T_{eff}$ was measured by means of Quasi steady-state photo conductance at an injection level of $10^{15}$ cm$^{-3}$, as is also the case for the other effective minority carrier lifetime data disclosed herein. As can be seen from the figure, both the p- and n-type silicon material, with the $SiN_x/SiO_xN_y$ passivation, demonstrate minority carrier lifetimes in the millisecond range, both for as-deposited and after high temperature annealing, with an increased lifetime after annealing. The lifetime is significantly improved compared to the reference sample with only $SiN_x$ passivation. The minority carrier lifetime after annealing, for the samples passivated by $SiN_x/SiO_xN_y$, was 2.3 millisecond and 3.2 milliseconds for the p- and n-type samples, respectively.

Figure 2A:
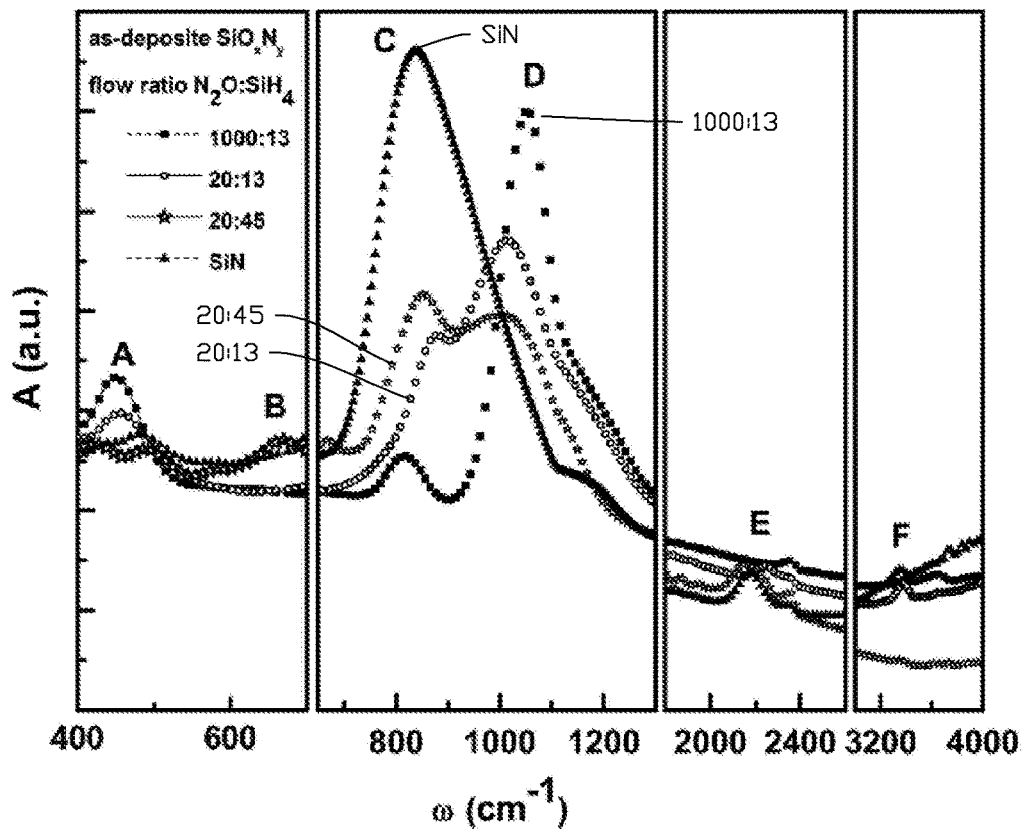
FIG. 2a shows the absorbance as a function of wavenumber in dielectric layers of different composition before high temperature treatment.
Figure 2B:
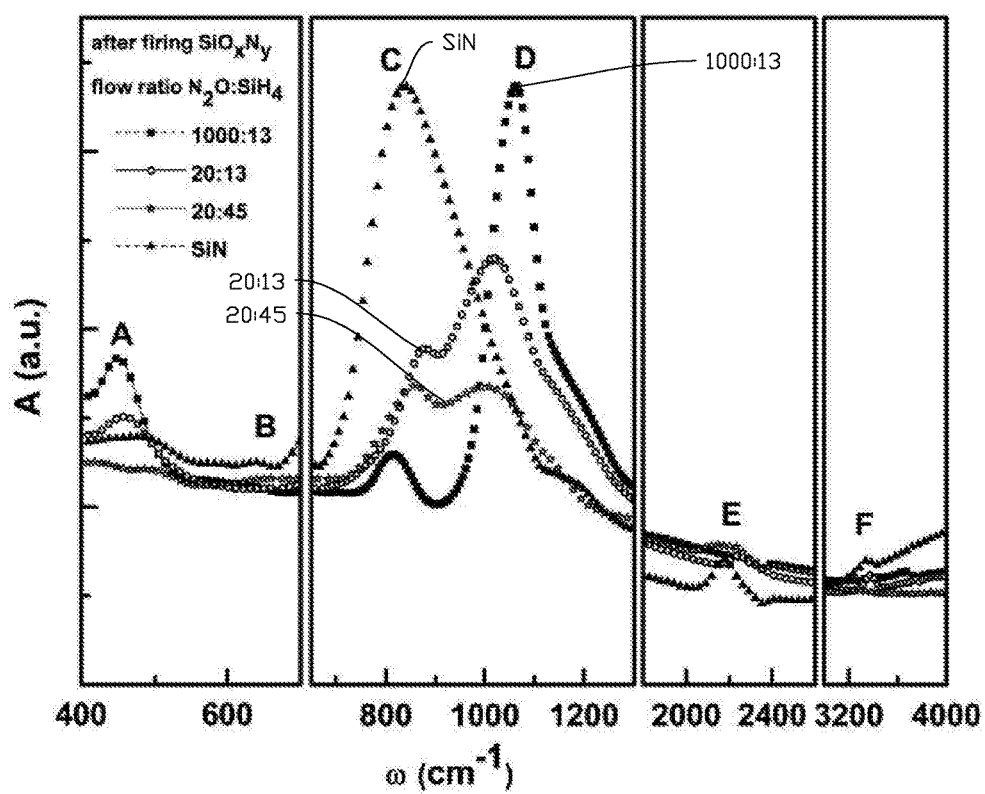
FIG. 2b shows the corresponding absorbance as a function of wavenumber in the same dielectric layers after high temperature treatment.

In FIGS. 2a and 2b absorbance, A, as a function of wavenumber, ω, is shown as measured by means of Fourier transform infrared spectroscopy (FTIR) of $SiO_xN_y$ layers of different compositions, before and after firing, respectively.

The results are compared to the absorbance in $SiN_x$. The two dominating peaks, C and D, in the Figures are representative of Si—N(a-s) bonds at 835 cm$^{-1}$ and Si—O(s) bonds at 1080 cm$^{-1}$, respectively, as obtained by the extremes of $SiN_x$ at one side and a flow ratio of 1000:13 of $N_2O$:$SiH_4$ on the other side. The two intermediate curves shows the absorbance in layers deposited with $N_2O$:$SiH_4$ flow ratios of 20:45 and 20:13. The peak A at 470 cm$^{-1}$ is indicative of Si—O(r) bonds, the peak B at 640 cm$^{-1}$ indicates the presence of $Si_3$—H(b) bonds, the peak E at 2300 cm$^{-1}$ indicates $Si_3$—H(s) bonds, while the peak F at 3400 cm$^{-1}$ indicates N—H(s) bonds). Even if the stoichiometry varies with the different flow ratios the layers seem to be quite stable after the high temperature step, as seen when comparing FIGS. 2a and 2b. These results, in combination with the results from not shown capacitance-voltage measurements, indicate that the passivation is obtained mostly from chemical passivation of dangling bonds at the crystalline silicon surface.

Figure 3:
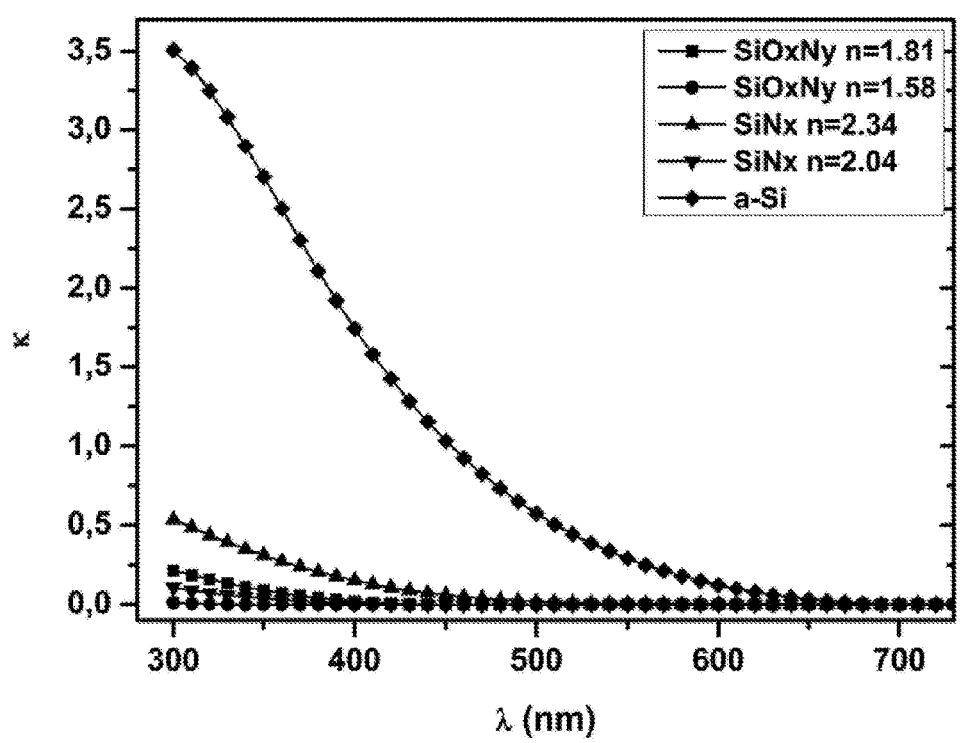
FIG. 3 shows the extinction coefficient as a function of wavelength for different dielectric layers.

The optical properties of the $SiO_xN_y$ also vary with deposition conditions, as indicated in FIG. 3, where the extinction coefficient, K, as measured by means of ellipsometry, is shown as a function of wavelength, λ. In comparison, it is shown that $SiO_xN_y$ has a significantly lower absorption than amorphous silicon in the spectral range up to 600 nanometers. In fact, the absorption of $SiO_xN_y$ is comparable to that of low-refractive hydrogenated $SiN_x$. Further, the best passivation results were obtained for $SiO_xN_y$ layers with a relative high silicon portion, i.e. deposited with a low $N_2O$:$SiH_4$ ratio, in this example 20:45.

Figure 4:
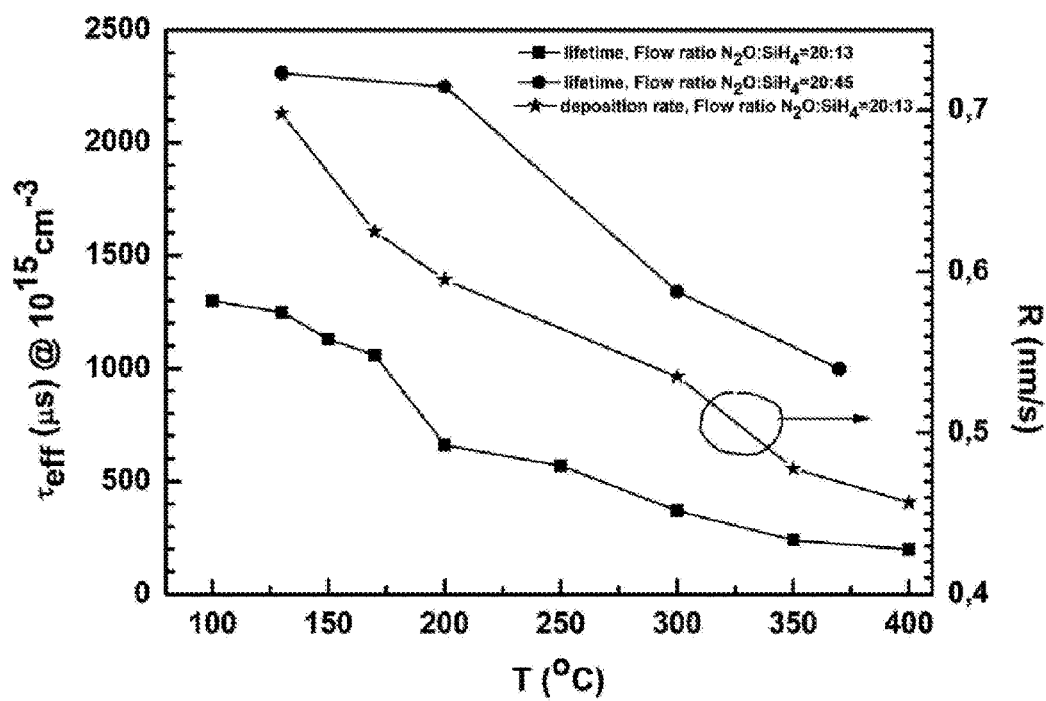
FIG. 4 shows the effective minority carrier lifetime and the deposition rate of silicon oxynitride as a function of deposition temperature.

FIG. 4 shows the minority carrier lifetime, $T_{eff}$ in microseconds, of the previously mentioned p-type silicon as well as the deposition rate of $SiO_xN_y$ as a function of deposition temperature ranging from 100° C. to 400° C. $T_{eff}$ is shown both for samples passivated by a $SiN_x$/$SiO_xN_y$ stack deposited with a $N_2O$ to $SiH_4$ gas flow ratio of 20:13 and 20:45. The deposition rate shown corresponds to the flow ratio of 20:13. As seen from the figure, the minority carrier lifetime of the sample on which $SiO_xN_y$ is deposited with the 20:13 gas flow ratio obtained a best $T_{eff}$ of 1 millisecond after firing, while the sample with $SiO_xN_y$ deposited with a flow ratio was 20:45 obtained a best $T_{eff}$ of 2.3 milliseconds after firing. $T_{eff}$ for both samples approximately doubled when lowering the deposition temperature from 400° C. to 130° C. and 100° C., respectively. Another beneficial effect as seen from the figure, is that the deposition rate also increases with reduced temperature, which is a bit surprising, taking into account results from the prior art. For instance, keeping the flow ratio of $N_2O$:$SiH_4$ at 20:13, the deposition rate increases from 0.46 to 0.7 nm/s when the deposition temperature was decreased from 400° C. to 130° C.

Figure 5:
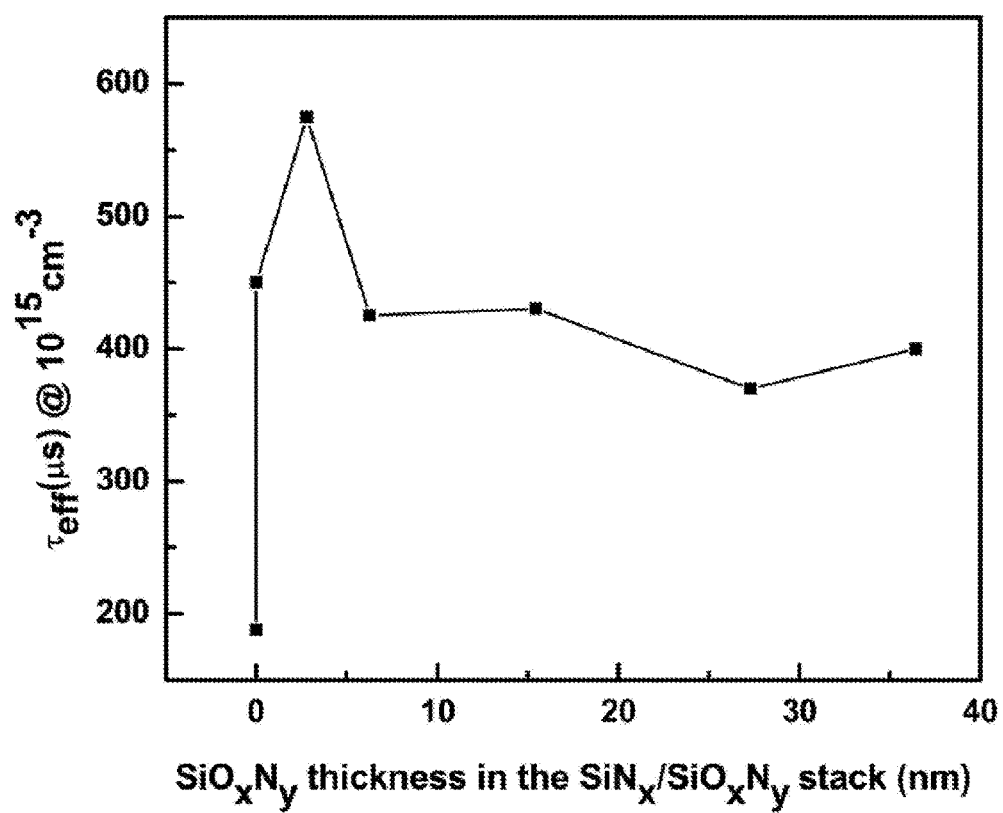
FIG. 5 shows the effective minority carrier lifetime as a function of the thickness of the silicon oxynitride layer.

In FIG. 5 the minority carrier lifetime, $T_{eff}$, as a function of the thickness of the $SiO_xN_y$ layer is shown under in an experiment performed under sub-optimal conditions. However, the results are believed to be valid also for $SiO_xN_y$ layers deposited at the optimal conditions mentioned above. There is a peak in minority carrier lifetime at a $SiO_xN_y$ layer thickness of 3 nm, while the lifetime for layers thicker than 10 nanometers is comparable to that at 10 nanometers.

Also, the deposition conditions of $SiN_x$ were shown to influence the passivation quality of the $SiN_x$/$SiO_xN_y$ stack. It was found that the passivation quality was improved with increasing deposition temperature of $SiN_x$. The best minority carrier lifetime was obtained when the $SiN_x$ capping layer was deposited at 400° C., with the minority carrier lifetime shown to increase with the deposition temperature from 130° C. to 400° C., both before and after firing. The variation of flow ratio of $SiH_4$:$NH_3$ affects the optical properties of the $SiN_x$ layer, while the variation was found to have little influence on the minority carrier lifetime. It was found that in order to optimize the passivation, the $SiN_x$ as a capping layer should have a thickness of around 40 nm or above.

Figure 6A:
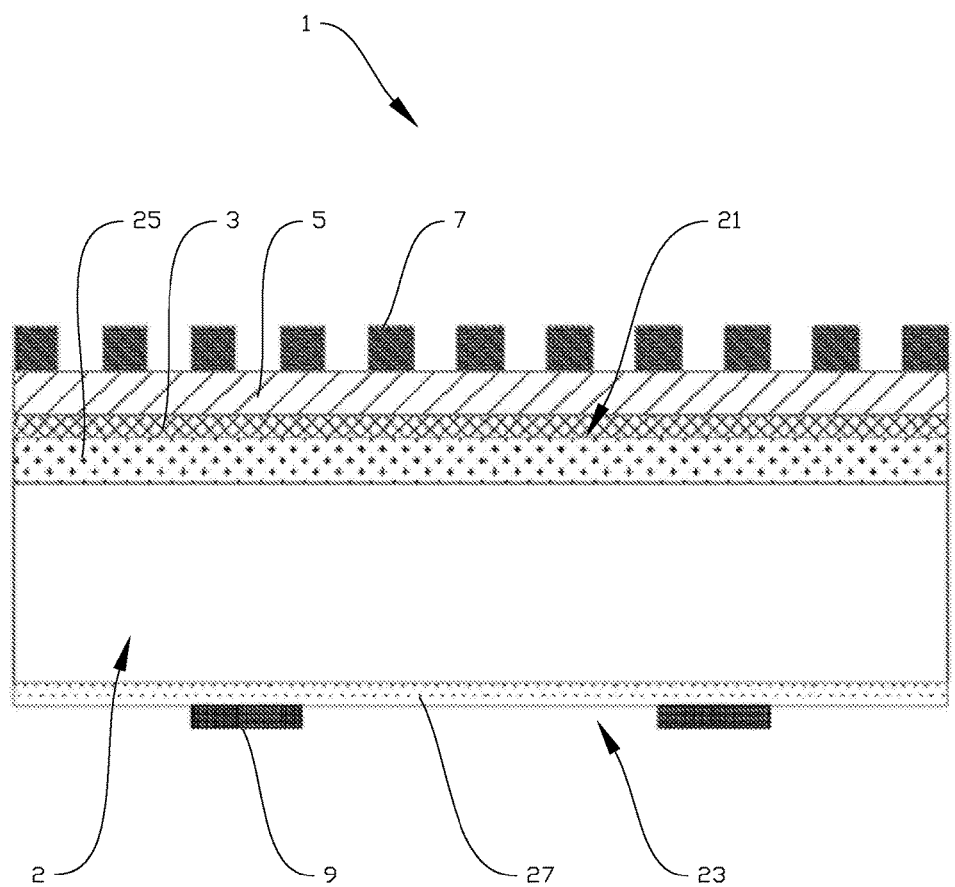
FIGS. 6a-6d show different embodiments f silicon solar cells according to the present invention.
Figure 6B:
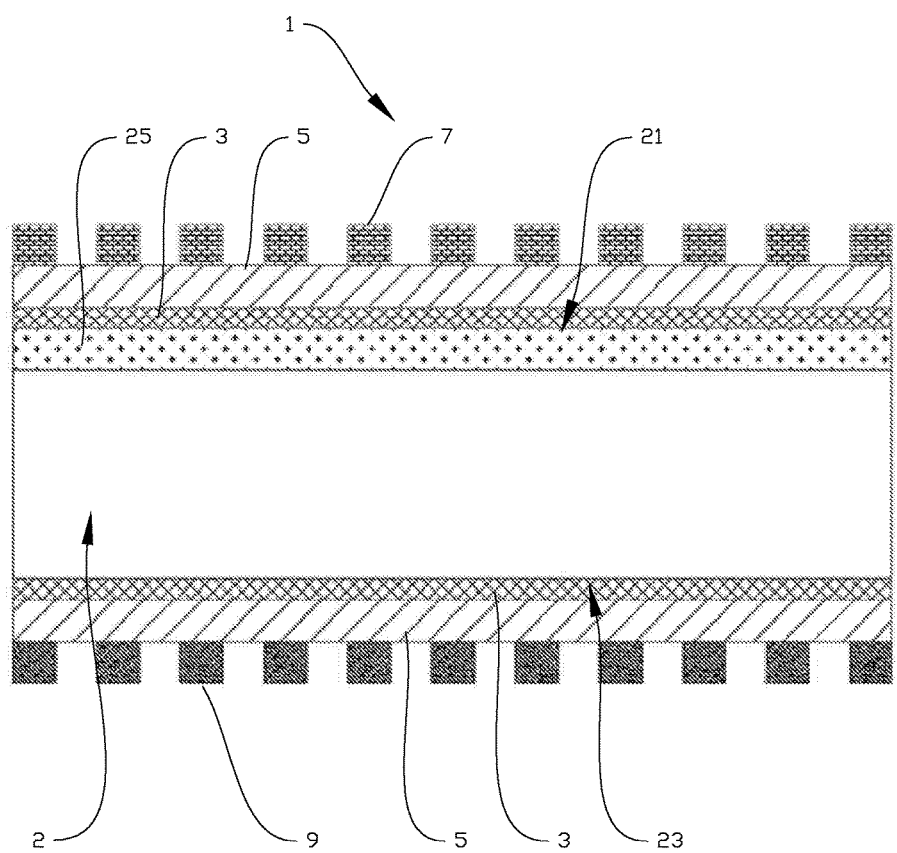

FIGS. 6a-6b show various examples of silicon solar cells provided with passivation stacks according to the present invention are shown. The functionality of such solar cells will be known to a person skilled in the art and will thus not be discussed in detail herein. The following figures are shown simplified and schematic, and the various features in the Figures are not drawn to scale. Identical reference numerals indicate identical or similar features in the figures.

In FIG. 6a, the reference numeral 1 indicates a silicon solar cell of a type that is usually referred to as a standard silicon solar cell. A crystalline silicon wafer 2 is passivated by means of a first layer 3 of $SiO_xN_y$ capped by a second layer 5 of a hydrogenated dielectric, here shown in the form of hydrogenated $SiN_x$. In sum the first and second layers 3, 5 act as a combined passivation and anti-reflection coating on a front surface 21 of the solar cell 1. A thin, highly doped region 25 is provided at the front surface 21 so as to constitute a p-n junction/diode together with the base doping of the silicon wafer 2. A set of front side contacts 7 is provided on top of the first layer 3 on the front side 21 of the solar cell 1, while a set of back side contacts 9 have been provided at a backside 23, contacting a highly doped backside region 27. The front side contacts are shown prior to firing, i.e. prior to establishing contact with the highly doped surface region 25.

FIG. 6b shows a so-called bifacial solar cell 1 where the passivation/anti-reflection stack constituted by the first layer 3 of $SiO_xN_y$ and the second layer 5 of $SiN_x$ is provided on both sides of the solar cell 1. In alternative embodiments the two layers 3, 5 of the passivation stack $SiN_x$/$SiO_xN_y$ may be provided only on the front surface side 21 or on the backside 23.

Figure 6C:
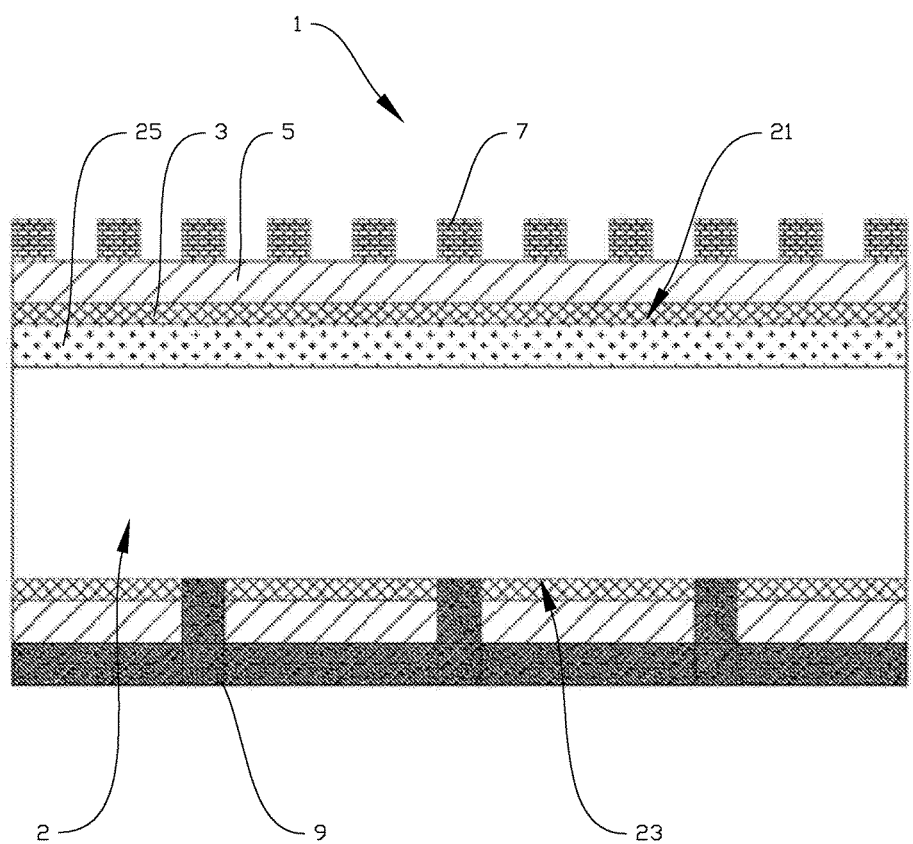
Figure 6D:
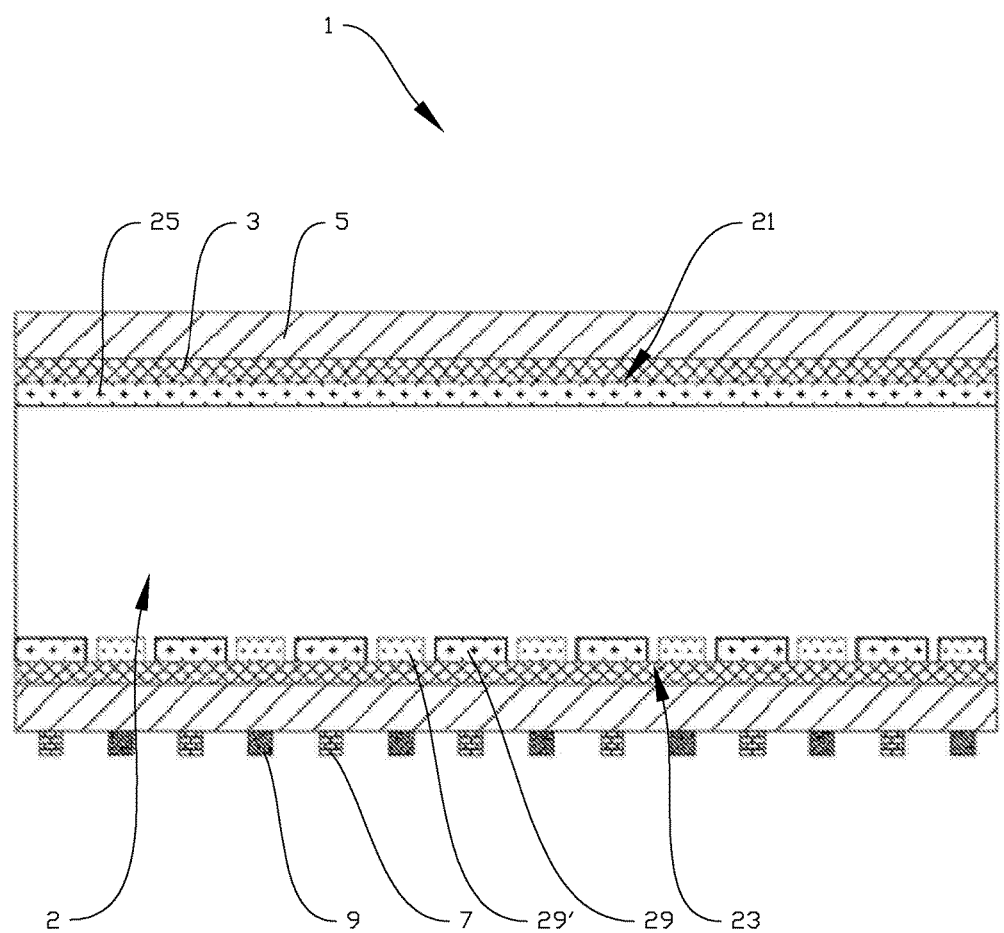

In FIG. 6c, the two layers 3, 5 of the passivation stack $SiN_x$/$SiO_xN_y$ are shown as provided on both sides of a passivated emitter rear contact (PERC) solar cell, while in FIG. 6d the two layers 3, 5 are shown used on both sides of a back-contacted back junction solar cell. In the latter case, both polarity contacts 7, 9 are provided on the backside 23 of the solar cell, usually in an interdigitated finger pattern following the shape of oppositely doped emitter and base regions 29, 29'. Also in these embodiments the two layers 3, 5 of the passivation stack $SiN_x$/$SiO_xN_y$ may be provided only on the front side 21 or on the backside 23.

What is claimed is:

1. A method for manufacturing a passivation stack on a crystalline silicon solar cell device, the method comprising the steps of:

providing a substrate comprising a crystalline silicon layer such as a crystalline silicon wafer or chip;

cleaning a surface of the crystalline silicon layer by removing an oxide layer at least from a portion of one side of the crystalline silicon layer;

depositing, on at least a part of the cleaned surface, a layer of silicon oxynitride; and depositing a capping layer comprising a hydrogenated dielectric material on top of the layer of silicon oxynitride where the layer of silicon oxynitride is deposited at a temperature from 100° C. to 400° C., the step of depositing the layer of silicon oxynitride including:

using $N_2O$ and $SiH_4$ as precursor gasses in an Ar ambient atmosphere or with no ambient atmosphere; and depositing silicon oxynitride with a gas flow ratio of N$_2$O to SiH$_4$ below 2.

2. The method according to claim 1, wherein the step of depositing the layer of silicon oxynitride includes using plasma-enhanced chemical vapour deposition.

3. The method according to claim 1, wherein the step of depositing the layer of silicon oxynitride includes depositing said layer with a thickness of less than 10 nm.

4. The method according to claim 1, wherein the step of depositing the capping layer of the hydrogenated dielectric material includes depositing said layer with a thickness of more than 25 nm.

5. The method according to claim 1, wherein the step of depositing the capping layer comprising the hydrogenated dielectric material includes depositing said hydrogenated dielectric material capping layer in the same step as depositing the layer of silicon oxynitride.

6. The method according to claim 1, wherein the step of depositing the capping layer comprising the hydrogenated dielectric material includes depositing a layer of hydrogenated silicon nitride.

7. The method according to claim 1, wherein the step of depositing the capping layer comprising the hydrogenated dielectric material includes depositing the layer at the temperature of depositing the layer of silicon oxynitride.

8. The method according to claim 1, wherein, after the deposition of the layer of silicon oxynitride and the hydrogenated dielectric material capping layer further comprising heating the crystalline silicon substrate at a temperature of above 700° C.

9. The method of manufacturing a crystalline silicon solar cell according to claim 1.

10. A crystalline silicon solar cell device obtainable by the method according to claim 1.

11. A crystalline silicon solar cell comprising the solar cell device of claim 10.

12. The method according to claim 1, wherein the step of depositing the layer of silicon oxynitride includes depositing silicon oxyitride with a gas flow ratio of N$_2$O to SiH$_4$ below 1.

13. The method according to claim 1, wherein the step of depositing the layer of silicon oxynitride includes depositing silicon oxyitride with a gas flow ratio of N$_2$O to SiH$_4$ of approximately 0.5.

14. The method according to claim 1, wherein the step of depositing the silicon layer of oxynitride includes depositing said layer with a thickness of less than 5 nm.

15. The method according to claim 1, wherein the step of depositing the silicon layer of oxynitride includes depositing said layer with a thickness of 3 nm.

16. The method according to claim 1, wherein the step of depositing the capping layer of the hydrogenated dielectric material includes depositing said layer with a thickness of 40 nm or more.

17. The method according to claim 1, wherein after the deposition of the layer of silicon oxynitride and the hydrogenated dielectric material capping layer further comprising heating the crystalline silicon substrate at a temperature of approximately 800° C.

* * * * *